(12) United States Patent
Altekrüger et al.

(10) Patent No.: US 6,341,173 B2
(45) Date of Patent: *Jan. 22, 2002

(54) DEVICE AND METHOD FOR THE DETERMINATION OF DIAMETERS OF CRYSTALS

(75) Inventors: Burkhard Altekrüger, Alzenau; Joachim Aufreiter, Alzenau; Dieter Brüss, Bruchköbel; Klaus Kalkowski, Gründau, all of (DE)

(73) Assignee: Leybold Systems GmbH, Hanau (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,322

(22) Filed: Aug. 27, 1998

(30) Foreign Application Priority Data

Sep. 3, 1997 (DE) .......................... 197 38 438
Apr. 21, 1998 (DE) .......................... 198 17 709

(51) Int. Cl.[7] .............. G06K 9/20; G06K 9/42; G06K 9/48; G06K 9/52; G06K 9/60
(52) U.S. Cl. ............ 382/141; 382/286; 382/318; 117/14; 117/203; 65/382; 65/29.14
(58) Field of Search .................. 382/141, 142, 382/152, 154, 286, 318; 117/13–15, 201–203; 702/40, 157; 250/559.14, 559.15, 559.24, 223 B; 356/384, 385, 30; 348/86, 88, 92, 82; 700/303; 65/382, 29.14; 438/16

(56) References Cited

U.S. PATENT DOCUMENTS

| | | | |
|---|---|---|---|
| 4,943,160 A | | 7/1990 | Gevelber et al. .......... 356/372 |
| 5,240,684 A | * | 8/1993 | Baba et al. ............... 422/249 |
| 5,378,900 A | * | 1/1995 | Hirano et al. ............. 117/201 |
| 5,653,799 A | | 8/1997 | Fuerhoff ................... 117/14 |
| 5,665,159 A | * | 9/1997 | Fuerhoff ................... 117/201 |
| 5,838,434 A | * | 11/1998 | Skramsted et al. ........ 356/243 |
| 5,853,479 A | * | 12/1998 | Aufreiter et al. .......... 117/201 |
| 5,892,855 A | * | 4/1999 | Kakinami et al. ......... 382/291 |
| 5,918,196 A | * | 6/1999 | Jacobson .................. 702/97 |
| 5,961,716 A | * | 10/1999 | White et al. .............. 117/14 |
| 6,030,451 A | * | 2/2000 | Labrie et al. ............. 117/14 |
| 6,226,032 B1 | * | 5/2001 | Lees et al. ................ 348/85 |

FOREIGN PATENT DOCUMENTS

| | | |
|---|---|---|
| DE | 1619967 | 7/1970 |
| DE | 2513924 | 2/1976 |
| DE | 145407 | 12/1980 |
| DE | 3325003 A1 | 1/1985 |
| DE | 19548845 | 7/1997 |
| EP | 0 472 907 | 3/1992 |
| EP | 0745830 A2 | 12/1996 |
| EP | 0 774 536 | 5/1997 |
| GB | 1457275 | 12/1976 |

OTHER PUBLICATIONS

IBM Technical Disclosure Bulletin, XP–00218456, 25:9, 4754–4755 (Feb. 1983).
Czochralski Growth of Single–Crystal Silicon—A State–of–the–Art Overview, Anthony Bonora, Sep. 1980, Microelectronic Manufacturing and Testing, pp. 44–46.

* cited by examiner

Primary Examiner—Leo Boudreau
Assistant Examiner—Brian P. Werner
(74) Attorney, Agent, or Firm—Smith, Gambrell & Russell, LLP (57) ABSTRACT

A device and process for the determination of the diameters of a crystal that is pulled from a liquified material. In this connection several video cameras are provided, each of which reproduces its own section along the vertical axis of the crystal or in a direction vertical to it. The image angles of the camera are laid out in such a way that the object to be reproduced completely fills the entire picture plane—at least in one direction. For objects with a small diameter; e.g., the crystal neck, a camera with a small image angle is used, while for objects with a large diameter; e.g., the crystal body, a camera with a large image angle is used.

30 Claims, 10 Drawing Sheets

DEVICE AND METHOD FOR THE DETERMINATION OF DIAMETERS OF CRYSTALS

INTRODUCTION AND BACKGROUND

The present invention relates to a device for determining the diameters of a crystal that is pulled from a liquified material and method for accomplishing the same.

Such a device is used, for example, for measuring the diameter of crystals when pulling single crystals in accordance with the Czochralski method.

In the field of crystal growth, a number of different methods are known; e.g., crystal growth from a gas phase, from a solution, or from a liquified material. The various methods for crystal growth from a liquified material have attained pre-eminence among the growth methods due to their highly developed processing technology and their production quantity.

The best known methods for crystal growth from a liquified material are the Kyropoulus method, the Bridgman method, and the Czochralski method. In the Kyropoulus method, a cooled seed crystal is dipped into a liquified material. In the Bridgman method, a crucible is lowered vertically into a temperature gradient. In the Czochralski method, a crystal is pulled from a liquified material.

With the Czochralski method the original material melts in a crucible as is also the case with the Kyropoulus method. A seed crystal is submersed in the liquified material and is wetted by it and, in so doing, fused. Then the seed crystal is pulled continuously upwards out of the liquified material while the temperature is lowered. In so doing, the crystal and crucible rotate counter-current. The speed of drawing it and the temperature of the liquified material are controlled in such a way that the crystal grows with a constant diameter after developing a shoulder. The orientation of the growing crystal corresponds to the seed crystal. This procedure is known in the art. See for example, Bonora, "Czochralski Growth of Single-Crystal Silicon—A State-of-the-Art Overview." *Microelectronic Manufacturing and Testing* (September 1980), pp. 44–46 the entire disclosure of which is relied on and incorporated herein by reference.

The target diameter of the single crystal pulled in production today is geared toward the wafer size processed in semiconductor technology—a size that has been taking on larger and larger values due to reasons of economy in spite of the advanced miniaturization of the electronic structural components, and thus today it is predominantly at 150 to 200 mm. There are, however, plans for wafers with a diameter of 300 to 400 mm. Given these dimensions the crystal structure and purity and especially the regularity of the diameter along the cylinder-shaped crystal play an important role in a flawless single crystal. The smoother the cylinder wall is, the smaller the expected expenditure on processing and the loss of materials. For this reason controlling the diameter during the target method is an important criterion for economy.

In practice, one comes up against considerable obstacles when trying to determine and control exactly the actual diameter of the crystal in all phases of the growing process.

To overcome these difficulties, mechanical, electrical, and optical solutions have already been proposed.

In the case of a mechanical solution, the weight of the crystal is monitored and the diameter is inferred from this weight (GB-PS 1 457 275). In so doing, a signal is produced that corresponds to the effective inert mass of the crystal when pulled out. In each case this signal is compared to the calculated expected value. If the two signals deviate from each other, the pulling speed is changed to match the actual crystal's diameter to the target diameter via a control system intervention. A disadvantage of this method is that it is subject to various uncertain interferences as a result of the slow crystal growth.

In a refinement of this solution, a method is proposed with which the effect of the heat delay is compensated for during the crystal formation (DE-OS 25 13 924).

Another known solution to the problem of measuring the diameter of a crystal pulled out of a liquified material based on mechanical principles makes use of the torsional moment that occurs because of the relative rotation between the crystal and the liquified material; see DE-OS 36 40 868.

Measuring the diameter of crystals with the help of an electrical method is also already known (DD-PS 145 407). In this connection the electrical resistance of the growing crystal is measured while the DC or AC voltage flows through the crystal or through the system of the heatable crucible, liquified material, crystal, and pulling objects. To measure the electrical resistance of the crystal, a floating contact area, which does not effect a reaction with the liquified material or influence the thermal conditions of the boundary surface between the liquified material and the crystal due to the specificity of its material and its structural peculiarities, is located on the surface of the liquified material.

In the case of another known method for pulling single crystal rods with a uniform diameter from a liquified material contained in a crucible, optical agents are used to measure the crystal diameter (DE-PS 16 19 969). In so doing, changes in the rod diameter are constantly balanced out by using a control system that consists of mechanical servo components and one or several emission detectors that send emissions onto the liquified material. The emission detectors are adjusted in such a way that they capture the emission energy produced by a small surface area of the liquified material directly near the growing crystal in the near infrared and the visible spectral region, and its optical path and the crystal axis form an acute angle.

Also known is an optical method for measuring the diameter of a semiconductor rod produced through zone melting. By this method, the rod is filmed by a TV camera in the area of the zone melting, the camera signal is transformed into a binary video signal by comparing it with a variable threshold value, and the diameter of the rod is measured at the site at which a jump in brightness is determined that characterizes the solid-fluid boundary that occurs in the axial direction (*Journal of Crystal Growth*, 13/14 (1972), pp. 619–23).

In an improvement of this method the site of the phase transition between the liquified material and the semiconductor crystal growing out of it is determined more accurately by taking more pictures with different threshold values and by examining the video signals obtained with the various threshold values to see whether a zone of a pre-specified minimum width exists that extends over the rod cross section and that is darker than a neighboring take-off area (DE-OS 33 25 003).

The precise determination of the actual diameter of a crystal by using the optical method is, however, subject to various interferences during the growth process that can falsify the results in such a way that carrying out the method accurately is no longer possible. As a result, the quality and results of the growth process can be strongly jeopardized. Included as interferences are, among other things, strongly variable brightness and contrast ratios on the objects to be measured; i.e., on the crystal, the liquified material, or the luminous meniscus ring around the crystal—and interfering reflections on the liquified material or the unsteadiness of the object to be measured caused by mechanical interference.

Moreover, to a certain extent the geometrical form of the corrected crystal can deviate significantly from the ideal form of a cylinder with a circular cross section. By varying the crystal diameter, visibility on the entire diameter of the crystal and the luminous meniscus ring belonging to it is considerably limited. Moreover, the components and devices for optimizing the temperature distribution limit the visibility of the crystal and further jeopardize it.

Even with the present normal crystal diameters of about 150 to 200 mm these problems with the detection and control of the crystal diameter can lead to considerable disadvantages with the growth process. For the future generation of 300- to 400-mm crystals, the problem of the reliable control of the crystal diameter will continue to intensify.

Also known is an optical system or process for controlling the growth of a silicon crystal in which the aforementioned problems are solved and in which the diameter of the silicon crystal is measured with the help of a TV camera, whereby the surface of the liquified material presents a meniscus, which is visible as a light area near the silicon crystal (EP 0 745 830 A2). In this system, first a test pattern of a part of the light area near the silicon crystal is photographed by the camera. Then the characteristics of the test pattern are detected. A valid characteristic of a test pattern is, for example, the intensity gradient. After this an edge of the light area is defined as a function of the detected characteristics. Then a contour, which includes the defined edge of the light area, is defined, and finally the diameter of the defined contour is determined, whereby the diameter of the silicon crystal is determined as a function of the desired diameter of the defined contour.

A disadvantage with this system is that the accuracy in some applications is not yet high enough and, more particularly, external interferences are not sufficiently taken into consideration.

Moreover, a device and method for the pulling of single crystals according to the Czochralski method, in which the diameter of a crystal is determined by an evaluation control unit, is known (DE 195 48 845 A1). In this connection two cameras are provided whose picture axes form an angle of 90 degrees. With these cameras, different points are detected on the same object; e.g., a meniscus ring. The focal distance and the image angle of these cameras are identical, as a result of which it is not possible to take a picture of areas of different sizes of an object on the picture plane while guaranteeing that at least one coordinate is completely filled.

Finally, there is a transition-angle identification system in which two cameras can be used whose picture axes form an angle in a vertical plane of a crystal (U.S. Pat. No. 4,943,160, FIG. 4). By the term transition angle one is to understand an angle that forms a meniscus surface with the vertical axis of a crystal and with an axis parallel to this vertical crystal axis. Other areas of the crystal are not picked up by the camera. The cameras also do not have a focal distance or image angle that is adjusted to the diameter of various crystal parts.

Therefore, an object of the present invention is to determine the diameter of a crystal with great precision by using an optical detection system.

SUMMARY OF THE INVENTION

In achieving the above and other objects, one feature of the invention resides in a device and process for the determination of the diameters of a crystal that is pulled from a liquified material. In this connection a plurality of video cameras are provided, each of which reproduces its own section along the vertical axis of the crystal or in a direction vertical to it. The image angles of the camera are laid out in such a way that the object to be reproduced completely fills the entire picture plane, at least in one direction. For objects with a small diameter, for example, the crystal neck, a camera with a small image angle is used. For objects with a large diameter, as for example, the crystal body, a camera with a large image angle is used.

More particularly, the present invention features a device for determining the diameters of a crystal that is pulled from a liquified material, employing a plurality of cameras for the reproduction of a corresponding number of areas of the crystal, and where the image angle ($\gamma$, $\delta$) of the plurality of cameras are matched to each of the areas reproduced by them.

In further detail, it is a feature of the present invention that the device for the determination of diameters of a crystal by using a plurality of cameras, the cameras are used one after another, but during the same process.

According to a still further feature of the present invention, the above and other objects are achieved by a process for the determination of the diameter of a crystal that is pulled from a liquified material, comprising carrying out the following steps using the evaluation control unit:

a) correction of the picture of the crystal for problems that arise from being taken at a slant so that, once the calibration is taken into consideration, the elliptical form of a crystal circumference in the reproduction is converted into a circle, b) scanning of the circumference that has been converted into a circle for its diameter, whereby the two corner points, which mark the diameter, are detected, c) searching for a third point on the circle, d) calculating whether the two corner points and the third point lie on a common ideal circle.

The advantage realized by the invention consists, in particular, of the fact that the camera resolution can be adjusted to each measurement problem by using at least two cameras. In the case of large crystal diameters the resolution can be doubled, for example, by using two cameras that make a composite picture possible. In addition, the problems that occur due to varying light strengths and contrast ratios can be eliminated. By taking into consideration the different relevance conditions for valid measurements, a stable signal and consequently an improved method of carrying out the process are also obtained. In addition to this, an automatic absolute-value calibration is possible, and the crystal diameter can be measured in such phases of the process in which a meniscus does not occur.

BRIEF DESCRIPTION OF DRAWING

The present invention will be further understood with reference to the accompanying drawings, wherein.

DETAILED DESCRIPTION OF THE INVENTION

Figure 1:
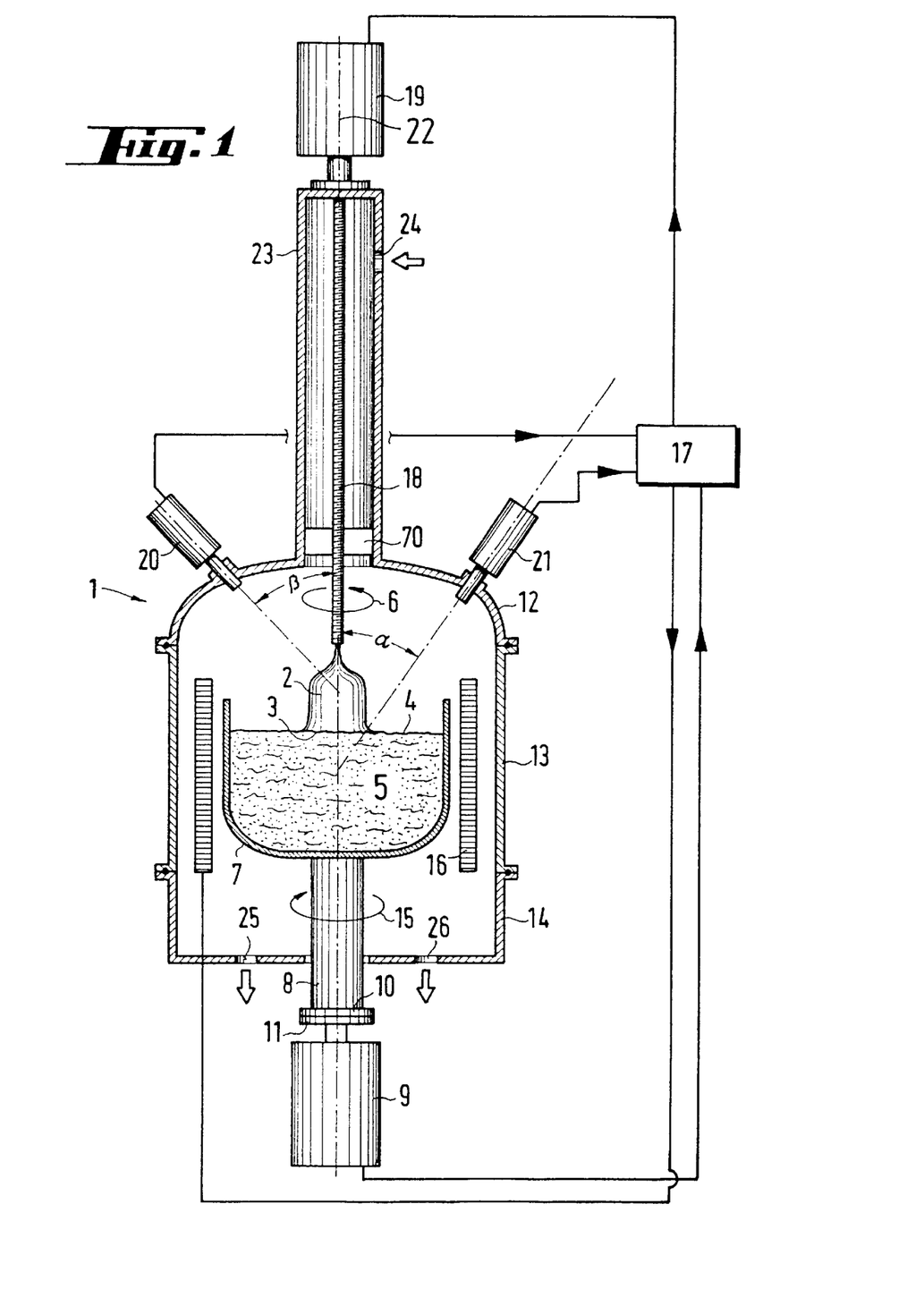
FIG. 1 is an elevational cross-section of a crystal-pulling device with two cameras lying one over the other, according to the invention.

In FIG. 1 a device 1 is shown with which it is possible to determine the diameter of a crystal 2 by using an optical method in accordance with the invention. The underside 3 of the crystal 2 rests on the surface 4 of a liquified material 5 in this case, while the crystal is rotated in the direction of arrow 6. The liquified material 5 is located in a crucible 7, which is driven by a shaft 8 of an electric motor 9. The shaft 8 and motor 9 are connected by the flanges 10, 11. The crucible 7 is located in a casing, which consists of an upper part 12, a middle part 13, and a lower part 14, and which can be rotated in the direction of arrow 15. An electrical heating device 16, which supplies electrical energy from a device 17, is located around the crucible 7.

The rotation of the crystal 2 takes place by using a pole 18; e.g., a threaded pin that is driven by an electric motor 19. This motor is also supplied with electrical energy from the device 17.

In the upper part 12 of the casing two cameras 20, 21 are located whose longitudinal axes form an angle $\alpha$ or $\beta$ to the vertical axis 22 of the pole 18 and the crucible 7.

The upper part 12 of the casing is connected to a pipe 23, which surrounds the pole 18 and has a gas inlet opening 24. In the bottom part 14 of the casing, gas outlet openings 25, 26 are provided. The pole 18 can not only be rotated by using the electric motor 19, it can also be raised. Control of the electric motors 9, 19 takes place via the device 17, which receives information from the cameras 20, 21 and evaluates this information.

A third camera, which is not shown in FIG. 1, can be located behind the pipe 22 or at another site.

The cameras 20, 21 have fixed focal distances and angles of image and reproduce a particular area of the crystal-neck, body, and the like. In this connection it is established that the reproduced object completely fills the picture plane at least in one coordinate so that optimal resolution is attained. Because the distance of the camera objective from the object to be reproduced is known, the focal distance is chosen in such a way that optimal conditions exist. By the term picture plane one is to understand the plane of the camera in which a picture is reproduced; i.e., when using conventional cameras the 24×36 film plane or when using electronic cameras the surface of the light-sensitive chips.

If the cameras are integrated into the system so they are fixed in the casing 12, preferably objectives with fixed focal distances are used, because the distance between camera and objective is a constant. It is, however, also possible; e.g., with a camera that is to observe the neck of the crystal, to design the camera with the growing, upward-moving crystal so it rotates in the casing 12 and to provide it with a zoom objective that is controlled automatically in such as way that the picture plane of the camera is constantly optimally utilized by the reproduced object. The constantly changing distance between the objective and object is thus taken into consideration through the varying focal distance.

With the help of the camera each diameter of the crystal area is determined and compared to the corresponding target values. The difference between the actual value and target value can then be made use of to change the crystal-pulling conditions.

Figure 2:
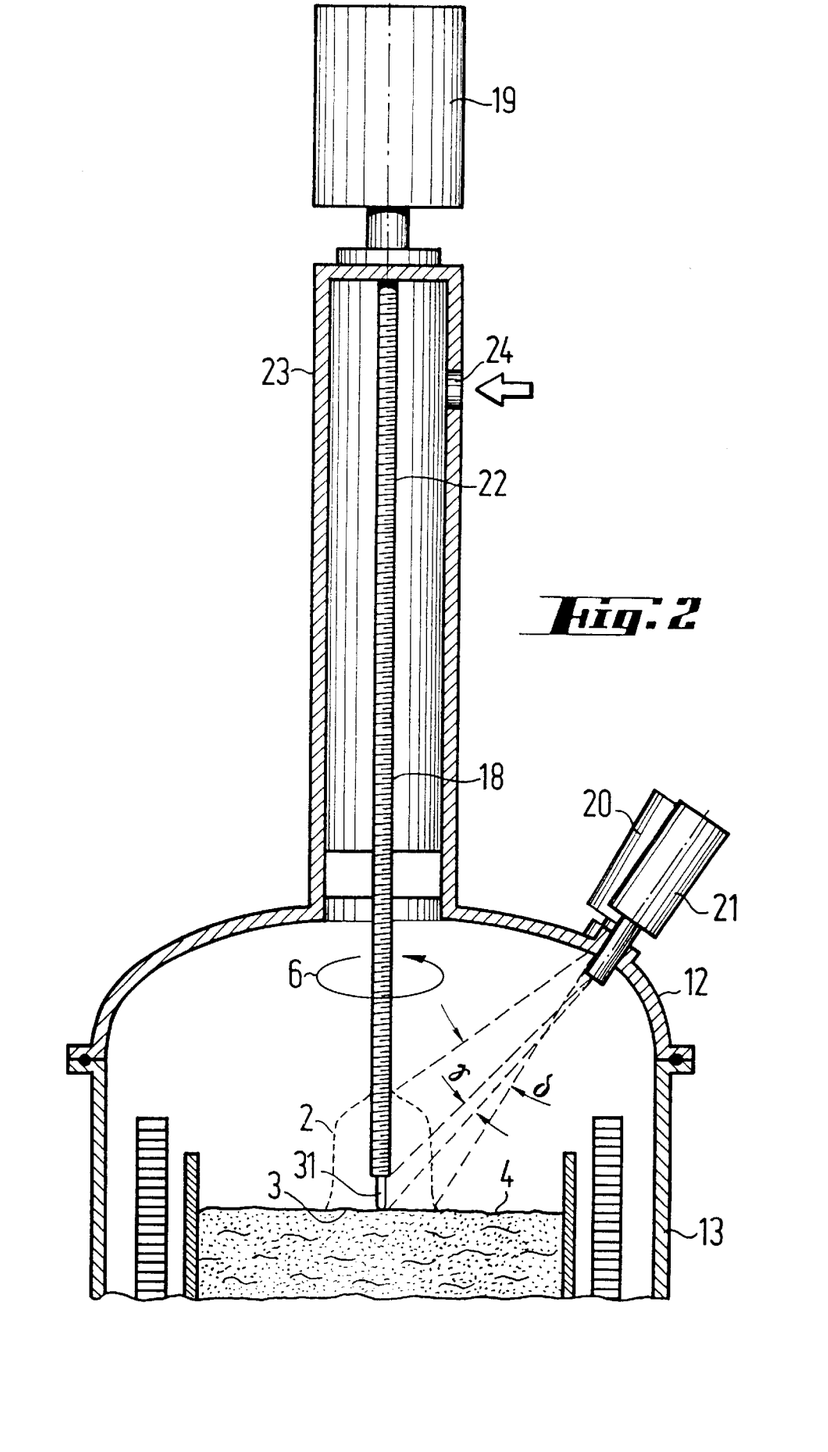
FIG. 2 is a partial cross-section view of a crystal-pulling device of the invention with two cameras positioned next to each other.

In FIG. 2 the upper part of the device shown in FIG. 1 is represented again, but now the two cameras 20, 21 are positioned next to each other. The pole 18 in this case is run underneath—it is the beginning of the pulling process—and has a seed crystal 31. The camera 21, which has a fixed focal distance, is aligned with the seed crystal 31; i.e., its image angle is $\gamma$. In so doing the seed crystal can be reproduced in such a way that it fills the total picture plane. This, in turn, allows one to examine the contours and other properties of the seed crystal 31 with precision.

The second camera 20 has an objective with another fixed focal distance and picks up the larger crystal 2, which is represented by dotted lines in FIG. 2, through the image angle $\delta$. Thus the larger crystal 2 can be reproduced in such a way that it fills the total picture plane of camera 20.

Through the use of two cameras 20, 21 the crystal can consequently be monitored completely in all of its growth phases. The cameras 20, 21 can be used at the same time, although preferably they are used one after another, on which occasion shifting from one camera to the other takes place automatically by control. It is understood that the successive use of the two cameras takes place within the same crystal-pulling process.

The use of only one camera with a zoom objective, which is already known (Japanese patent application Sho 62-87482 of Oct. 9, 1985), would be a disadvantage when using an evaluation algorithm and is not comparable to two cameras, each of which has a fixed focus. With a fixed-focus camera the angle of image can be designed in such a way that the entire object to be photographed fills the film plane entirely. With a zoom camera, however, only parts of the film plane are covered by the object. If, for instance, the zoom objective is focused on parts and the seed crystal 31 fills the entire film plane, the seed crystal will cover only a part of the film plane when there is a wide-angle focus. Of course, the entire crystal 2 may cover the entire film plane with a wide-angle focus, but that does not change the fact that the seed crystal 31 takes up only a small part of the film plane and can, therefore, be examined with less accuracy. With two fixed-focus cameras of different focal distances, however, two different areas of a crystal can be reproduced and evaluated at the same time or one after another. At any rate, two different areas of a crystal can be reproduced and evaluated during one uniform process. One can use two zoom cameras instead of two fixed-focus cameras, but problems with calibration will result, for it requires focusing with 100% accuracy.

Figure 3:
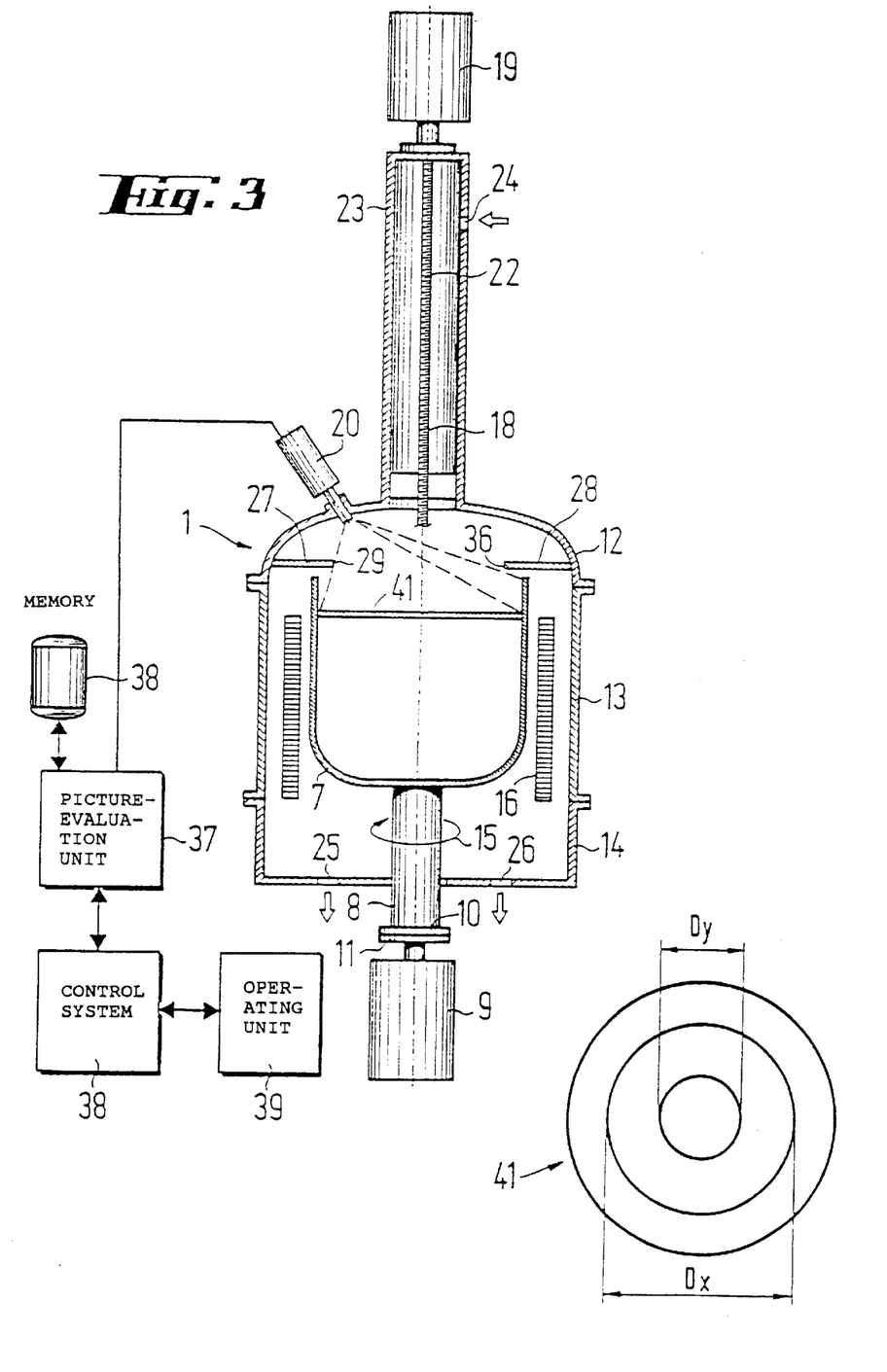
FIG. 3 is an elevational cross-section view of a crystal-pulling device according to the invention during calibration of the camera.

FIG. 3 shows how such a calibration can take place. For reasons of simplicity, only one camera 20 is shown; it is to be understood, however, that the calibration of a second or third camera can take place in a corresponding way.

Two variations of the calibration are shown in FIG. 3. In the case of the first variation, two demarcations 27, 28 are designated that can also be parts of a circular ring. The edges 29, 36 of these demarcations serve as markers for the target positions. They are photographed by the camera and then evaluated in a picture-evaluation unit 37. This picture-evaluation unit 37 is connected to a mass memory 38 for storing the calibration data. The information from the picture-evaluation unit 37 is fed to a control system 38, which can also be loaded with the data of an operating unit 39.

Instead of the demarcations 27, 28, in a second variation a plate 41 that is provided with special calibration markings can be positioned, even at the expected height of the surface of the liquified material. This plate 41 can be provided with a reference picture on its surface that contains various "reference diameters" $D_x$, $D_y$. These reference diameters can be determined, stored in the memory 38, and then later processed. Because the calibration process generally takes place before the actual crystal-pulling process, the demarcations 27, 28 and/or the plate 41 can be dismantled after the calibration.

Figure 4:
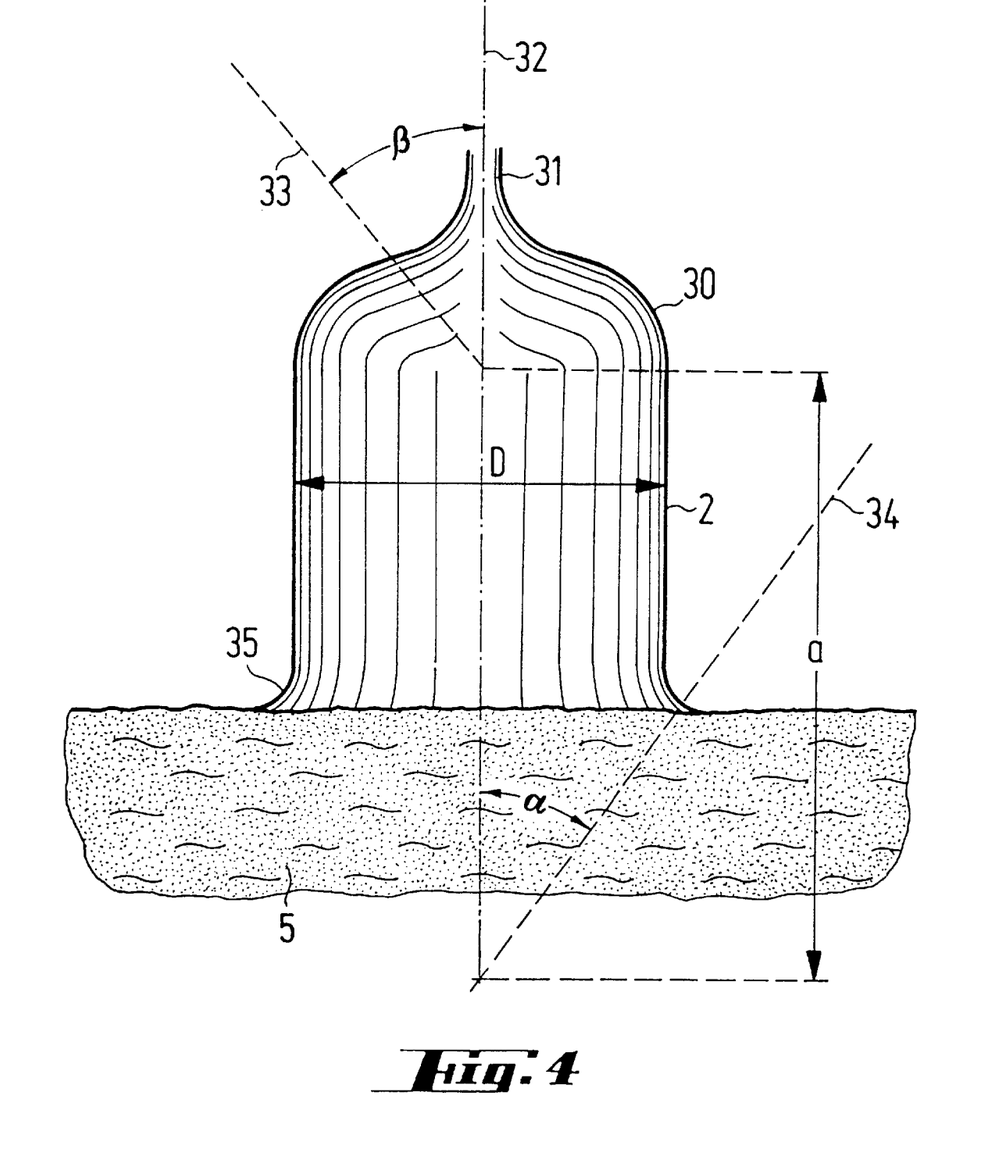
FIG. 4 is an enlarged representation of a crystal pulled from the liquified material.

In FIG. 4 an enlarged representation of the crystal 2 that is formed from the liquified material 5 in accordance with FIG. 1 is shown. This crystal essentially has a cylindrical form and a shoulder 30 in the upper area, which passes over into a thin neck 31. This neck 31 corresponds to the seed crystal or seed 31 (FIG. 2) with which the crystal formation process is initiated. The vertical axis of the crystal is designated as 32, while the longitudinal axes of the cameras 20, 21 (not shown in FIG. 4) are designated as 33 and 34 in accordance with FIG. 1. The arrangement of the cameras and their axes is represented in their general form in FIGS. 1 and 4. In practice they are aligned with the meniscus so that the axes 33 and 34 intersect in the point that is also the intersection point between the surface of the liquified material 5 and the axis 32. Such arrangements are described in detail below. The diameter D of the crystal 2 can vary independently of the height, although the crystal essentially has the form of a cylinder. The lower area of the crystal 2, which lies between the cylindrical part and the liquified material 5, is designated as 35. To a certain extent the meniscus 35 is the connecting link between the crystal 2 and liquified material 5. It represents a narrow ring-shaped zone between the solidified crystal and the liquid material, which is clearly brighter than the liquified material itself. The crystal appears to be surrounded by a light ring on the boundary surface between crystal and liquified material. The optical phenomenon, which is not easy to explain, occurs through the reflection of the radiation emitted chiefly from the crucible wall onto the concave transition area between the liquified material and crystal so that an observer looking from above onto the liquified material and crystal sees a darker crystal, which is surrounded by a lighter luminous ring at the height of the liquified material. During the pulling process the ring expands as the liquified material is lowered into the crucible and as the existing crystal grows by about threefold. At the end of the pulling process, this makes it increasingly more difficult to determine the diameter accurately by reproducing the luminous ring on a suitable sensor.

If the cameras 33, 34 are built in so they are stationary, camera 34 can, e.g., be turned on during one of the first time segments of the crystal-pulling process. At the beginning of a second time segment camera 33 is then turned on. The use of such a method of operation is called, as mentioned above, a successive method of operation.

In FIGS. 5a to 5d four views of a growing crystal are represented from the view of a camera positioned at a slant above the crystal. One recognizes in this connection only the essential elements; i.e., liquified material, pole 22, seed crystal 31, the crystal 2 itself, and the meniscus 35. The crucible 7 is left out.

Figure 5A:
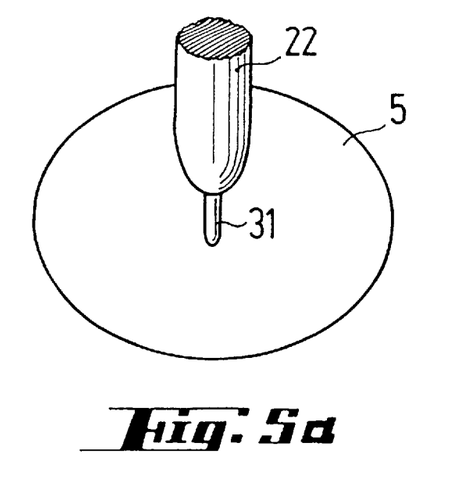
FIGS. 5a–5d are diagrammatic representations of crystal growth.
Figure 5B:
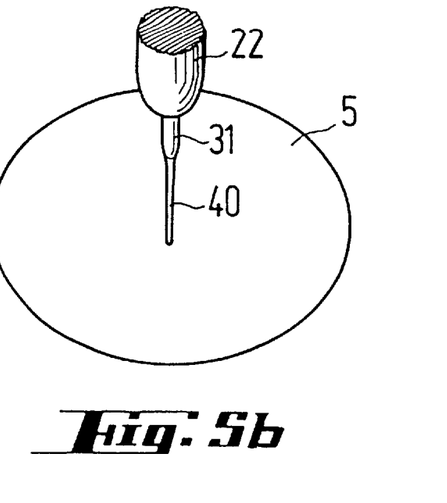
Figure 5C:
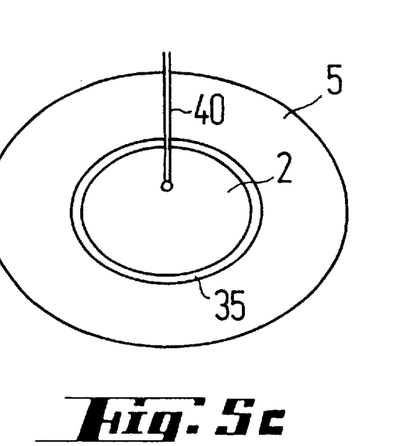
Figure 5D:
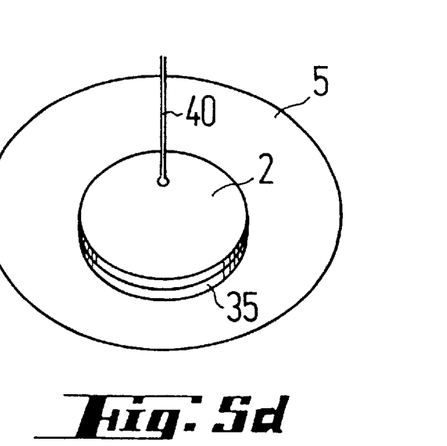

FIG. 5a shows the beginning of the crystal formation when the liquified material 5, which is connected to the pole 22, comes into contact with the seed crystal 31. If the pole 22 is then raised, the situation represented in FIG. 5b results: A slim, cylindrically formed body 40, which has contact with the liquified material 5, is then formed. If the pole 22 is, however, raised further, the formed body 40 is extended and a crystal 2 that has a circular circumference and that is surrounded by a brightly radiating meniscus 35 is formed at its end. This situation is represented in FIG. 5c. When the pole 22 is raised even more, the cylindrical crystal 2 continues to grow out of the liquified material 5. With a top view from a camera at a slant, the back part of the meniscus can no longer be recognized; only the front partial curve is visible.

Figure 6:
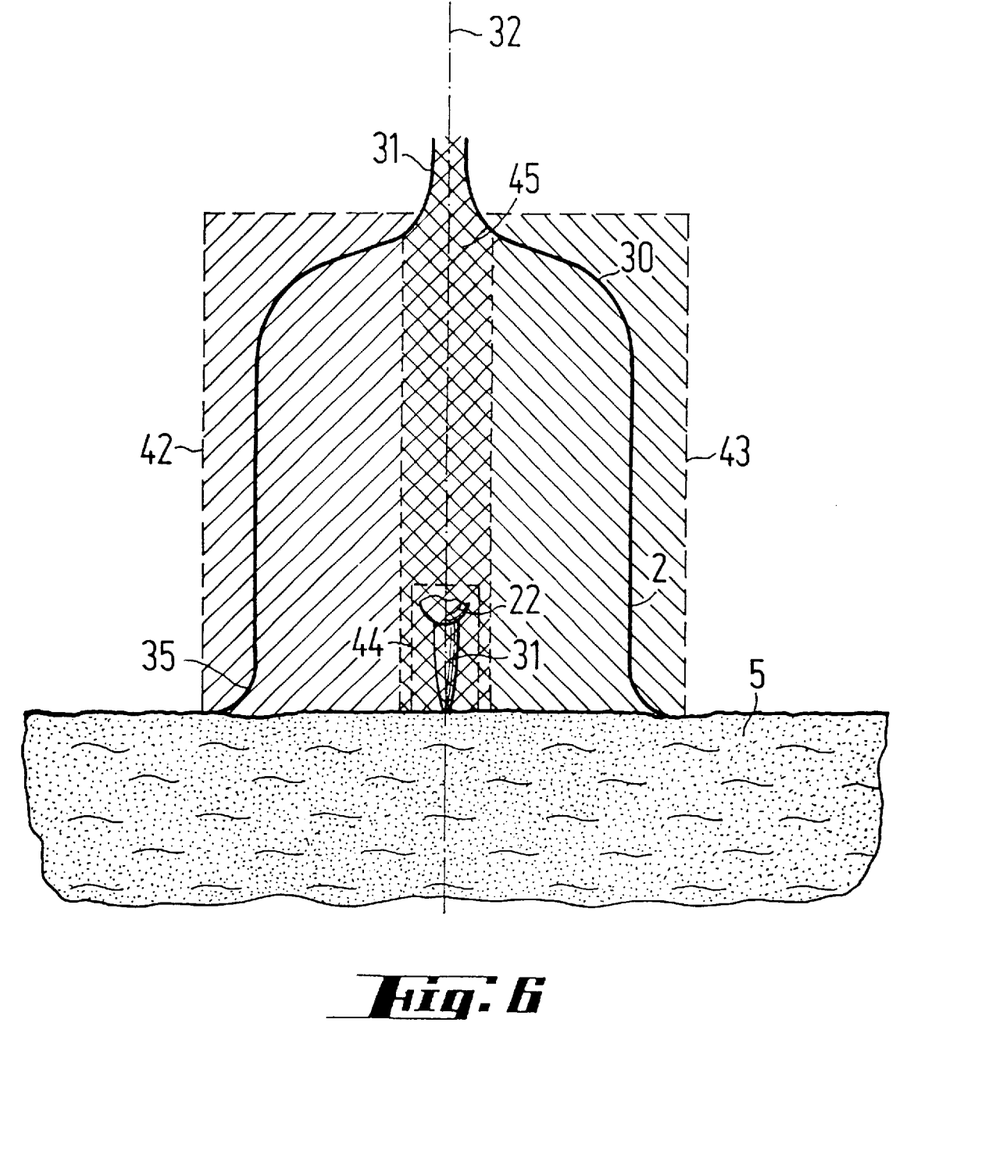
FIG. 6 is a schematic representation of a crystal and a seed crystal, which are photographed by three cameras.

In FIG. 6 the crystal 2 is represented again; it is nonetheless picked up not by two, but by three cameras (not shown). The first camera picks up only the left half of the crystal and reproduces the part framed with a shaded rectangle 42. The second camera, however, picks up the right half of the crystal 2 and reproduces the part framed with the shaded rectangle 43.

The third camera is responsible for reproducing the seed crystal 31, which is symbolized by the rectangle 44. The reproductions of the two first cameras can overlap in a boundary area 45. By using two cameras to reproduce the crystal, the resolution can be increased, because the entire film plane of a camera is filled with only one half of the crystal instead of the entire crystal. The parallel operation of both cameras is therefore covered in a direction vertical to the longitudinal axis of the crystal.

Serial operation is thus possible with the invention; in this case the cameras reproduce different areas of the crystal along the vertical axis of the crystal on the reproduction plane in such a way that the object being reproduced fills the reproduction plane of the camera in at least one direction—the x or y direction—on which occasion the cameras are activated one after the other. Parallel operation is, however, possible; in this case the cameras reproduce different areas of the crystal along a line running perpendicular to the vertical axis of the crystal on the reproduction plane in such a way that the objects being reproduced fill the reproduction plane of the camera in at least one direction, whereby the cameras are activated at the same time.

Figure 7:
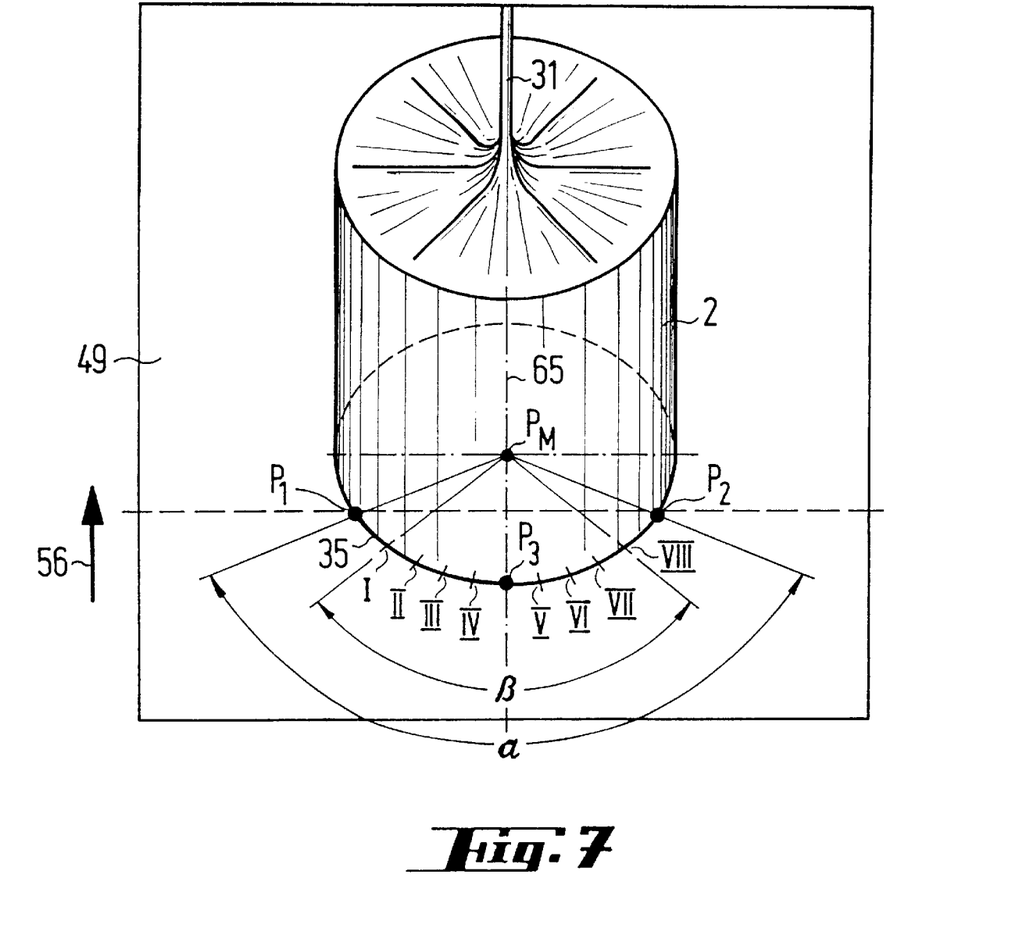
FIG. 7 is a perspective view of a crystal to explain the process for determining the diameter of a crystal according to the invention.

FIG. 7 shows crystal 2 in the camera reproduction. By using this reproduction, the way in which the diameter of the crystal 2 is determined will be described in detail. The frame 49 can be equated with a CCD chip, with which the crystal 2 is reproduced. The chip is then scanned line for line in the direction of the arrow 56. In so doing, the bright areas and/or gradients in the light intensity of the individual areas inside the frame 49 are detected. The goal is, first, to determine the points $P_1$ and $P_2$, which limit the visible part of the meniscus. These points $P_1$ and $P_2$ are found when a jump in brightness occurs on two sites of a scanned line. By calculating the distance between the points $P_1$ and $P_2$, one obtains the quasi-diameter of the crystal. This is, however, not the true diameter, because the reproduction in FIG. 7 is distorted perspectively. It is, however, possible to determine the true value by making a comparison with a distance $P_1$–$P_2$ from the calibration. The distorted distance $P_1$–$P_2$ can thus be assigned an undistorted distance $P_1'$–$P_2'$ so that one knows the true diameter $P_1'$–$P_2'$ in this case.

This diameter can then be compared with a maximum diameter. Only when the newly determined diameter is larger than the stored maximum diameter is the new diameter stored.

In the next step one determines whether the points $P_1$–$P_2$ lie symmetric to the center line 65. If this is the case, the distance of the connecting line between $P_1$ and $P_2$ to the lower edge becomes smaller than half the distance between $P_1$ and $P_2$. If this is the case, the measured diameter $P_1$–$P_2$ is the maximum diameter.

Then the point $P_3$ is determined. In so doing the scanning beam runs line for line from below to above. If only one jump in brightness occurs on a line, then point $P_3$ has been found. Because all three spheric points are then known, the circle and its center point $P_M$ can be determined. In the next step the angle $\alpha$ is determined, which is yielded when lines are drawn from the center point $P_M$ through the points $P_1$ and $P_2$.

For accuracy the angle $\alpha$ is reduced by an angle $\gamma$ so that $\beta = \alpha - \gamma$.

Then a prespecified number of measurement points I–VIII are distributed on the partial circle defined by the new angle $\beta$ and from these measurement points, the circle that is the "best fit" is determined.

The measurement points I to VIII must be distributed evenly over the visible arc, not over a calculated arc, for $\alpha$ is a visible arc. The reduction of the angle $\alpha$ by $\gamma$ occurs so that one is sure to be able to determine the measurement points I and VIII on the edges.

By using the smallest possible number of measurement points a high accuracy and resolution can be obtained for the diameter signal. A compensating curve, to a certain extent, is laid by a large number of measurement points.

Figure 8:
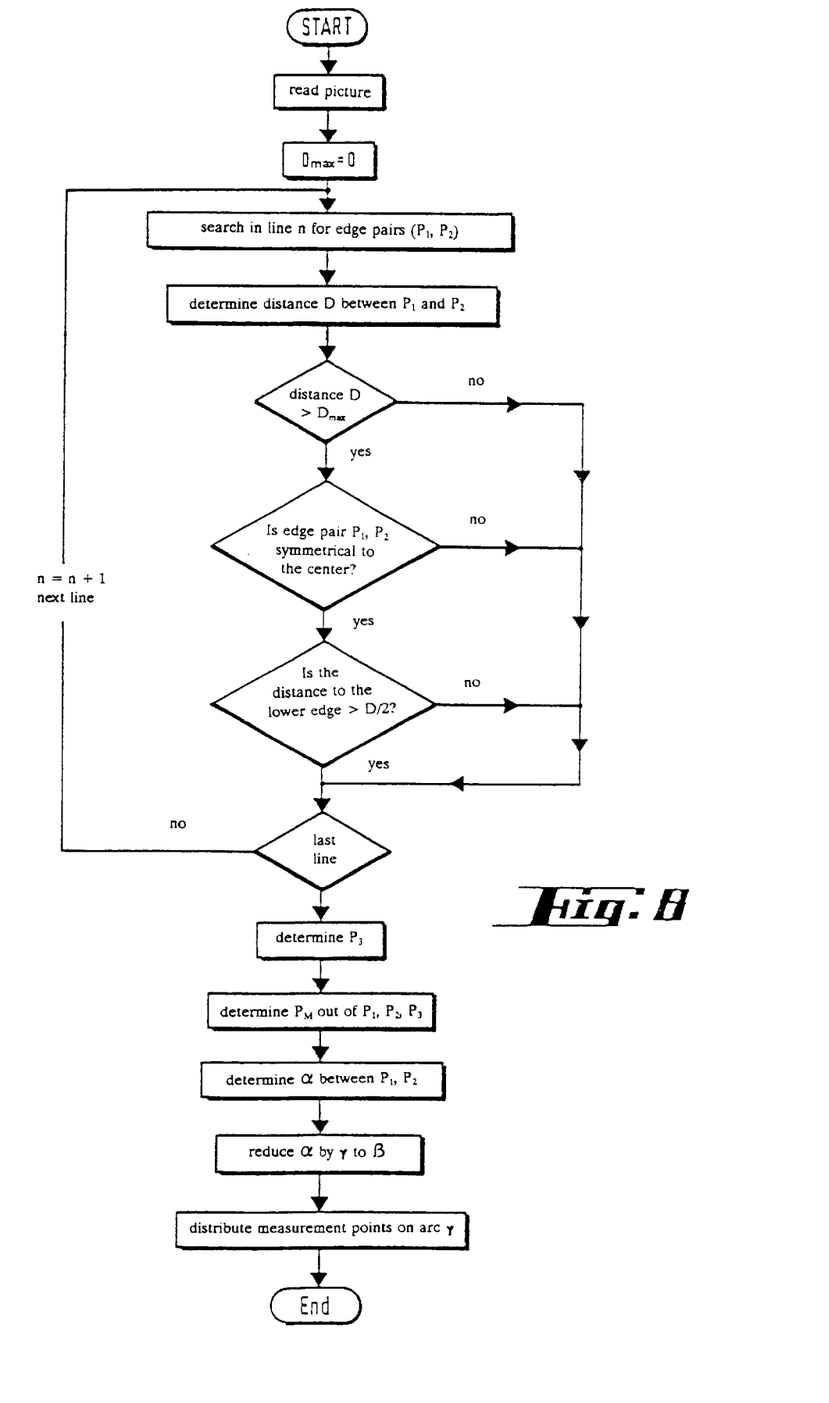
FIG. 8 is a flow diagram for the method of determining the diameter of the crystal.

FIG. 8 shows a flow diagram of the method of determining the diameter of the crystal. As one can see, first the picture to be taken is read by a camera. This picture approximately corresponds to the crystal 2 shown in FIG. 7. It is then corrected by a known algorithm so the ellipse with the points $P_1$, $P_2$, $P_3$ becomes a circle with corresponding points. This corrected reproduction, which need not correspond to a concrete optical representation but which is realized by data stored in the memory, is then subjected to another process.

The corrected picture that is read is then searched line for line for the points $P_1$ and $P_2$. In this connection, one begins with the lower line—the reason why n is set equal to 1, where n is the number of the line. If two points are found in a line, the further tests represented in the flow diagram take place. They are of special meaning for the reliability of the determination of the diameter.

One must be sure that the points $P_1$ and $P_2$ stem from the crystal, i.e., from the meniscus and not from sources of interference—e.g., reflections on the liquified material.

If all the tests are passed with positive results, the value determined is stored in the variable $D_{max}$.

After the site on the flow diagram, "Is the distance to the lower edge>D/2?", one can thus choose with "yes" that $D_{max}=D$, and the determined points $P_1$ and $P_2$ are stored. After this the next line (n=n+1) is processed. If in this line a value for D is found that is larger than the value already determined for $D_{max}$, then the new value for D is stored as $D_{max}$. This process is carried out line for line. After the last line has been processed, $P_1$ and $P_2$ are known and the distance between $P_1$ and $P_2$ exists in the variables $D_{max}$. In the middle between $P_1$ and $P_2$ one then searches for $P_3$.

The distance from the connecting line $P_1$–$P_2$ to the lower edge of the picture is designated as the distance to the lower edge. The condition that the distance be smaller than D/2 is fulfilled when the front area of the meniscus circle is visible. This is a requirement in this case.

After $P_3$, $P_M$, $\alpha$, and $\beta$ are determined, the measurement points I to VIII (see FIG. 7) are distributed on the arc. From these measurement points a "best fit circle" is then determined; i.e., a compensating or corrected curve is determined by these points.

Figure 9:
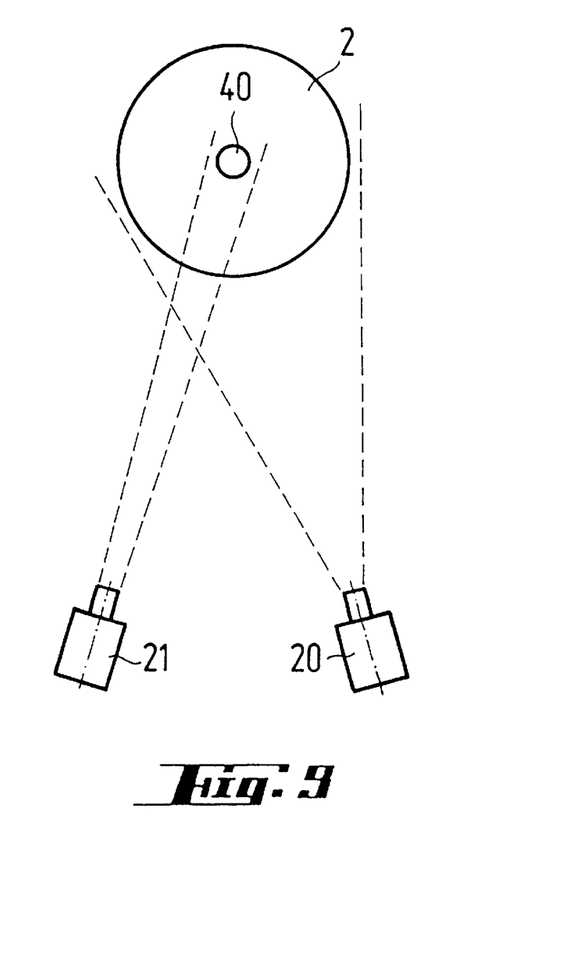
FIG. 9 is a diagrammatic view from above onto two cameras and a crystal.

In FIG. 9 two cameras 20, 21 and a crystal 2 are shown in a view from above. The one camera 20 has a large focal distance and reproduces the neck 40 that has arisen on the seed crystal 31. On the other hand, the camera 21 has a small focal distance and reproduces the entire crystal 2. The camera 20 in this connection serves to reproduce the situation with a process step in accordance with FIG. 5b, while the camera 21 is intended to reproduce the situation with the process steps in accordance with FIG. 5c, 5d.

Figure 10:
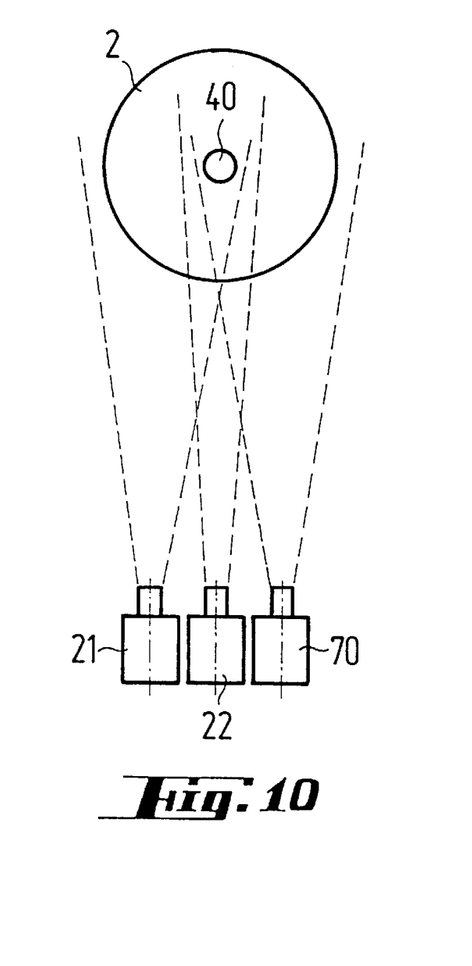
FIG. 10 is a diagrammatic view from above onto three cameras and a crystal.

FIG. 10 shows the use of three cameras 21, 20, 70 in a diagrammatic view from above. Cameras 21, 70 both have a short focal distance and in each case reproduce half of the crystal 2. Their use is activated during the process steps in accordance with 5c, 5d. The cameras 21, 70 are evaluated at the same time so that the advantage of doubled resolution results. Camera 22 has a long focal distance and serves to reproduce the neck 40 during the process step in FIG. 5b.

Figure 11:
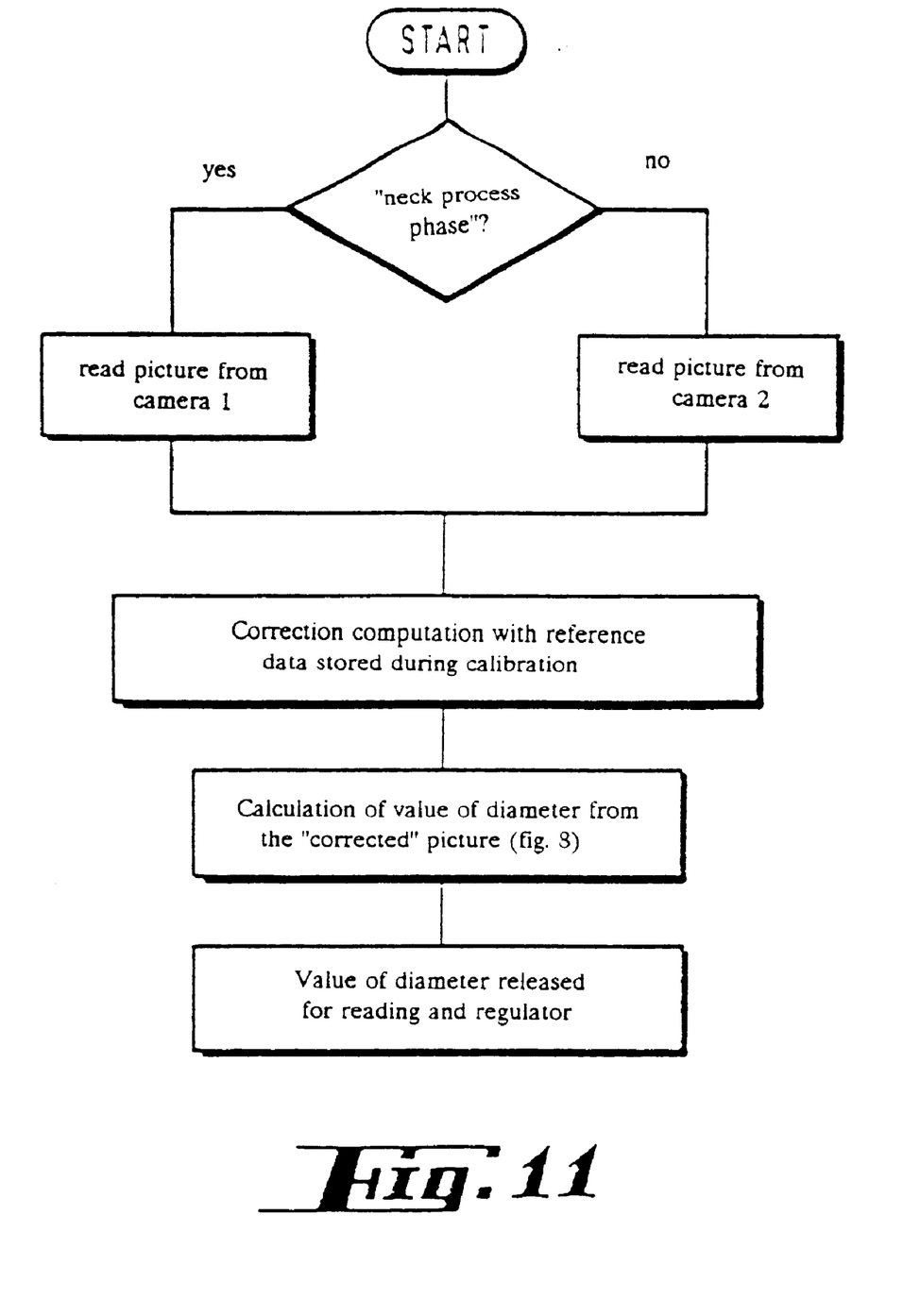
FIG. 11 is a part of a flow diagram when using two cameras in accordance with the invention.

In FIG. 11 a part of a flow diagram is shown that is relevant for the camera constellation in accordance with FIG. 9. First one checks whether the "neck process phase" exists. If this is not the case, camera 21 is activated. If, however, the "neck process phase" exists, camera 20 is activated. The pictures supplied by the cameras 20, 21 are then corrected by using the reference dates stored during the calibration. The corrected data need not be reproduced optically; it is sufficient if they are deposited in the memory.

The calculation of the diameter of the crystal from the corrected representation of the crystal 2 or neck 40 then takes place according to the guidelines of the flow diagram in FIG. 8.

The resulting value for the diameter is then determined and fed to a controller.

With the invention it is thus possible to carry out an accurate and trouble-free determination of the actual and up-to-date crystal diameter in all phases of the growth process—something that is an essential condition for optimal process control and crystal quality.

The two or more camera pictures are evaluated in a special way, as a result of which, e.g., problems are eliminated that occur due to very different light-intensity and light-contrast conditions. Thus not only the absolute information about the brightness of the liquified material, meniscus, and crystal is evaluated, but the intensity gradients $\Delta J/\Delta X$ and $\Delta J/\Delta Y$ are also made use of in the evaluation. In addition, the geometrical distortions that result due to the position and the incline of the picture plane and observation angle of a camera are corrected. Add to this an automatic absolute-value calibration of the dimensions for a selectable picture plane by using a standard model. By forming and evaluating gradients, the edges of the crystal and meniscus ring are recognized and defined with certainty. An up-to-date crystal diameter is determined by using a special, multi-stage search and evaluation algorithm; by determining the edges, maximum diameter, and relevance criteria; by setting measurement lines; and by determining the diameter by means of a best fit from a multitude of measurement points, etc.

To rule out irrelevant picture contents and picture objects, various relevance criteria are made use of; e.g., a process-dependent definition and extraction by scanning of relevant symmetry conditions; the definition and extraction of relevant intensity, contrast, and gradient conditions; the definition and extraction of meaningful upper and lower limits for the dimensions of the measurement objects; and a comparison with stored typical model pictures.

The search and measurement algorithm are continuously checked according to the aforesaid criteria.

In this way the exact crystal diameters can be determined even with limited lighting conditions and with a meniscus ring that is either only partially visible or partially able to be evaluated. In this connection it does not matter whether covering takes place due to a large angle of image with a large crystal diameter or due to partial covering with a variable diameter or due to a partial covering by building it into the equipment. The "complete circle" of the crystal is in such cases limited by computation methods.

If the meniscus ring is only partially covered, an automatic optimization of the choice of measurement points takes place.

Moreover, the invention allows for adjustments in the respective process conditions, among other things by adjusting filter constants, geometrical conditions such as symmetry and circular form, intensity and gradient conditions, window sizes, and/or lower and upper relevance limits for the crystal diameter.

In certain phases of the crystal-pulling process in which a meniscus does not occur, the crystal diameter can, nonetheless, be measured directly.

Further variations and modifications of the foregoing will be apparent to those skilled in the art and are intended to be encompassed by the claims appended hereto.

German priority applications 197 38 438.2 and 198 17 709.7 are relied on and incorporated herein by reference.

We claim:

1. A device for determining at least two diameters of a crystal that is pulled from a liquified material, comprising a plurality of two-dimensioned cameras for the reproduction of m different areas along the vertical axis of the crystal, whereby m≧2, said areas changing in diameter as the crystal is pulled, wherein at least two of said cameras have different respective image angles and fixed focuses, said image angles being aligned with the vertical axis of the crystal wherein said different image angles are selected such that each of the different areas that is reproduced fills the entire picture plane of the cameras in at least one dimension, and means for selecting a first of said two cameras for reproducing a first area, and selecting a second of said two cameras for reproducing a second area, and determining said diameter of both areas from the reproductions.

2. The device according to claim 1, wherein an area reproduced by one of the cameras is a thin neck of the crystal.

3. The device according to claim 2, wherein a camera reproduces a seed crystal.

4. The device according to claim 1, wherein an area reproduced by one of the cameras is a cylindrical part of the crystal.

5. The device according to claim 1, wherein one of the cameras reproduces areas having different diameters and the image angle of said one of the cameras matches the larger diameter.

6. The device according to claim 1, wherein an area reproduced by one of the cameras is a meniscus of the crystal.

7. The device according to claim 1, wherein the longitudinal axis of at least one of the cameras is aligned vertically with the longitudinal axis of the crystal.

8. The device according to claim 1, wherein the longitudinal axis of at least one of the cameras forms an angle $\alpha$ with the longitudinal axis of the crystal, with $0°<\alpha<90°$.

9. The device according to claim 1, wherein different cameras reproduce partial areas the same areas of the crystal.

10. The device according to claim 1, wherein different cameras reproduce partial areas of the same body of the crystal.

11. The device according to claim 1, wherein the longitudinal axis of a first camera is positioned so it is offset by 180° from the longitudinal axis of a second camera.

12. The device according to claim 1, wherein the cameras are positioned next to each other.

13. The device according to claim 1, wherein the cameras are automatically calibrated.

14. The device according to claim 1, wherein elements, which are part of a casing that surrounds a crucible in which the liquified material is located, are provided for the calibration.

15. The device according to claim 1, wherein a calibration plate is placed in a crucible temporarily.

16. The device according to claim 15, wherein the calibration plate is positioned on a surface of the liquified material in the crucible.

17. The device according to claim 1 for the determination of diameters of a crystal by using the cameras, wherein the cameras are used one after another, but during the same time during a process.

18. The device according to claim 17, wherein the cameras reproduce different positions in the vertical longitudinal axis of the crystal.

19. The device according to claim 1 for the determination of diameters of a crystal by using the cameras, wherein the cameras are used at the same time during a process.

20. The device according to claim 19, wherein the cameras reproduce different positions horizontal to the crystal.

21. Device according to claim 1, wherein the areas of the crystal reproduced by the cameras are evaluated one after another.

22. A process for the determination of the diameter of a crystal that is pulled from a liquified material, using a crystal-camera system, said crystal-camera system comprising a plurality of two-dimensional cameras having different image angles, which are actuated automatically successively based on the area of the crystal that requires reproduction, said process comprising:
   a) performing a calibration of the crystal-camera system and determining data corresponding to the calibration;
   b) reproducing a crystal or portion thereof from a slant position, by taking a picture of the crystal or portion thereof by means of said automatically selected camera, and determining data corresponding to the picture;
   c) correcting the picture of the crystal by comparing the data corresponding to the calibration with the data corresponding to the picture, so that an elliptical circumference of the crystal or portion thereof is converted into a circular circumference;
   d) scanning the circular circumference for its diameter, wherein two corner points, which mark the diameter, are deleted;
   e) searching for a third point on the circular circumference; and
   f) calculating whether the two corner points and the third point lie on a common ideal circle.

23. The process according to claim 22, wherein areas of the crystal or portion thereof reproduced by the cameras are evaluated one after another.

24. The process according to claim 23, wherein criteria of relevance for ruling out irrelevant picture contents and picture objects are used.

25. The process according to claim 22, wherein edges of the crystal or meniscus ring are determined by the formation and evaluation of gradients.

26. The process according to claim 25, wherein criteria of relevance for ruling out irrelevance picture contents and picture objects are used.

27. The process according to claim 22, wherein criteria of relevance for ruling out irrelevant picture contents and picture objects are used.

28. A process for the determination of the diameter of a crystal that is pulled from a liquified material, using a crystal-camera system, said crystal-camera system comprising a plurality of two-dimensional cameras having different image angles, which are actuated automatically successively based on the area of the crystal that requires reproduction, comprising the following steps:
   a) reproducing a meniscus of said crystal by means of said automatically selected camera on a picture plane, wherein said camera takes said picture from a slant position relative to the crystal;
   b) scanning the reproduced meniscus and detecting gradients of brightness within the scanned area;
   c) detecting two corner points of the outmost positions of the visible portion of the meniscus;
   d) searching for a lowest point of the meniscus;
   e) calculating an ellipse based on said detected two corner points and the lowest point; and
   e) converting the ellipse into a circle in accordance with a known algorithm.

29. The process according to claim 28, wherein areas of the crystal or portion thereof reproduced by the camera are evaluated one after another.

30. The process according to claim 28, wherein criteria of relevance for ruling out irrelevant picture contents and picture objects are used.

* * * * *